US 6,650,168 B1

(12) United States Patent
Wang et al.

(10) Patent No.: US 6,650,168 B1
(45) Date of Patent: Nov. 18, 2003

(54) HIGH-SPEED LEVEL SHIFTER USING ZERO-THRESHOLD MOSFETS

(75) Inventors: Wen-Tai Wang, Taipei (TW); Chung-Hui Chen, Hsin Chu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 10/261,344

(22) Filed: Sep. 30, 2002

(51) Int. Cl.[7] .................. H03K 19/0175; H03L 5/00
(52) U.S. Cl. .............................................. 327/333
(58) Field of Search ........................ 327/306, 319, 327/327, 328, 333, 427, 437, 541–543; 326/62, 68, 81–85

(56) References Cited

U.S. PATENT DOCUMENTS

| 5,539,334 A | | 7/1996 | Clapp, III et al. | 326/68 |
|---|---|---|---|---|
| 5,559,464 A | * | 9/1996 | Orii et al. | 327/333 |
| 5,821,800 A | | 10/1998 | Le et al. | 327/333 |
| 5,963,061 A | | 10/1999 | Briner | 327/55 |
| 6,002,290 A | | 12/1999 | Avery et al. | 327/333 |
| 6,414,534 B1 | * | 7/2002 | Wang et al. | 327/333 |
| 6,489,828 B1 | * | 12/2002 | Wang et al. | 327/333 |
| 6,556,061 B1 | * | 4/2003 | Chen et al. | 327/333 |
| 6,563,372 B1 | * | 5/2003 | Fournel | 327/543 |
| 6,566,930 B1 | * | 5/2003 | Sato | 327/333 |

* cited by examiner

Primary Examiner—My-Trang Nuton
(74) Attorney, Agent, or Firm—George O. Saile; Stephen B. Ackerman; Douglas R. Schnabel (57) ABSTRACT

A new level-shifting circuit is achieved comprising: a first cascaded switch comprising a first NMOS transistor and a first zero threshold NMOS transistor, the second cascaded switch comprises a second NMOS transistor and a second zero threshold NMOS transistor, and the cross-coupled pull-up comprises a first PMOS transistor and a second PMOS transistor. The sources of both of these PMOS transistors are coupled to a high voltage supply. The gate of the second PMOS transistor and the drain of the first PMOS transistor are coupled to the drain of the first zero threshold NMOS transistor to form an inverted output. The gate of the first PMOS transistor and the drain of the second PMOS transistor are coupled to the drain of the second zero threshold NMOS transistor to form a non-inverted output.

25 Claims, 5 Drawing Sheets

CONVENTIONAL TEST CIRCUIT

HIGH-SPEED, ZERO THRESHOLD
TEST CIRCUIT

HIGH-SPEED LEVEL SHIFTER USING ZERO-THRESHOLD MOSFETS

BACKGROUND OF THE INVENTION

(1) Field of the Invention

The invention relates to digital integrated circuits, and more particularly, to a circuit that allows a digital signal to be level shifted from a low voltage supply to a high voltage supply.

(2) Description of the Prior Art

Ultra deep submicron CMOS technologies are used to create digital integrated circuits with very high transistor densities and very high switching speeds. These submicron CMOS transistors have very thin gate oxide and very low threshold voltages. To facilitate use of ultra deep submicron CMOS processes, the supply voltage for the high-density logic core must be lowered to improve device reliability. Supply voltages of between about 2.5 Volts and 3.3 Volts, which have been typical for prior art CMOS logic devices, have to be reduced to a low voltage regime of, for example, about 1 Volt for a 0.13 micron CMOS process.

While the supply voltage of the core logic section is being reduced, the supply voltage for the input/output section of the integrated circuit must be kept at a higher level to assure adequate signal-to-noise ratio and compatibility with other devices. Where digital signals in the low voltage core must be transmitted off the integrated circuit, signal level shifting is therefore necessary. A level shifting circuit is the bridge that transforms signals from a low core voltage (VDD) to a high I/O voltage (VDDQ) and is used to increase the upper voltage swing of the low voltage signal, from low voltage to high voltage. However, the conventional level shifter does not work as the core voltage decreases down to about 1 Volt as will be seen in an analysis of the prior art.

Figure 1:
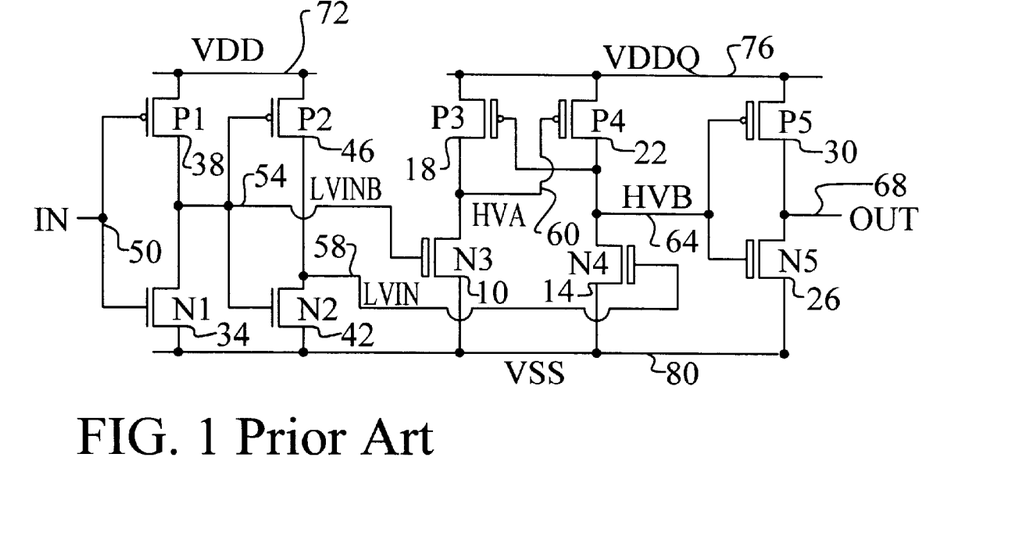
FIG. 1 illustrates a prior art level shifting circuit.

Referring now to FIG. 1, a prior art level shifting circuit is shown. This level shifting circuit uses low voltage and high voltage transistors. Low voltage transistors, such as P1 38 and N1 34, are used in the low supply voltage VDD 72 section. High voltage transistors, such as P3 18 and N3 10, are used in the high supply voltage VDDQ 76 section. The low voltage transistors have a thinner gate oxide than the high voltage transistors. In addition, the low voltage transistors have a low threshold voltage of perhaps about 0.3 Volts for NMOS and about −0.3 Volts for PMOS. By comparison, the high voltage devices have a threshold voltage of perhaps about 0.7 Volts for NMOS and about −0.7 Volts for PMOS.

The prior art level shifting circuit generates buffered versions, LVINB 54 AND LVIN 58, of the input, IN 50. These low voltage signals are coupled to the gates of the high voltage NMOS devices N3 10 and N4 14. The differential pair formed by N3 and N4 combine with the cross-coupled transistors P3 18 and P4 22 to generate the level-shifted outputs HVA 60 and HVB 64. An inverter buffer is used to generate the output, OUT 68.

An analysis of the ac operation of the prior art level shifting circuit reveals a serious switching delay when the design is used in an ultra-deep submicron process. In such processes, the VDD 72 voltage is very small to facilitate the usage of very small devices with very thin gate oxides, shallow junctions, and shrinking threshold voltages. However, the important input transistors of the circuit, N3 10 and N4 14, still have large voltage thresholds. Therefore, the $I_{dsat}$ of the thick gate NMOS devices, for the relatively small gate drive of VDD, is also small. If, as in the example case, N3 10 must drive node HVA 60 against P3 18 during a transition, then the reduced $I_{dsat}$ of N3 10 will cause a long transition delay. Further, as device geometry is reduced, the design of the prior art circuit cannot scale. At some point, the low voltage supply VDD 72 will be too small to effectively switch ON the high voltage NMOS devices N3 10 and N4 14.

Figure 2:
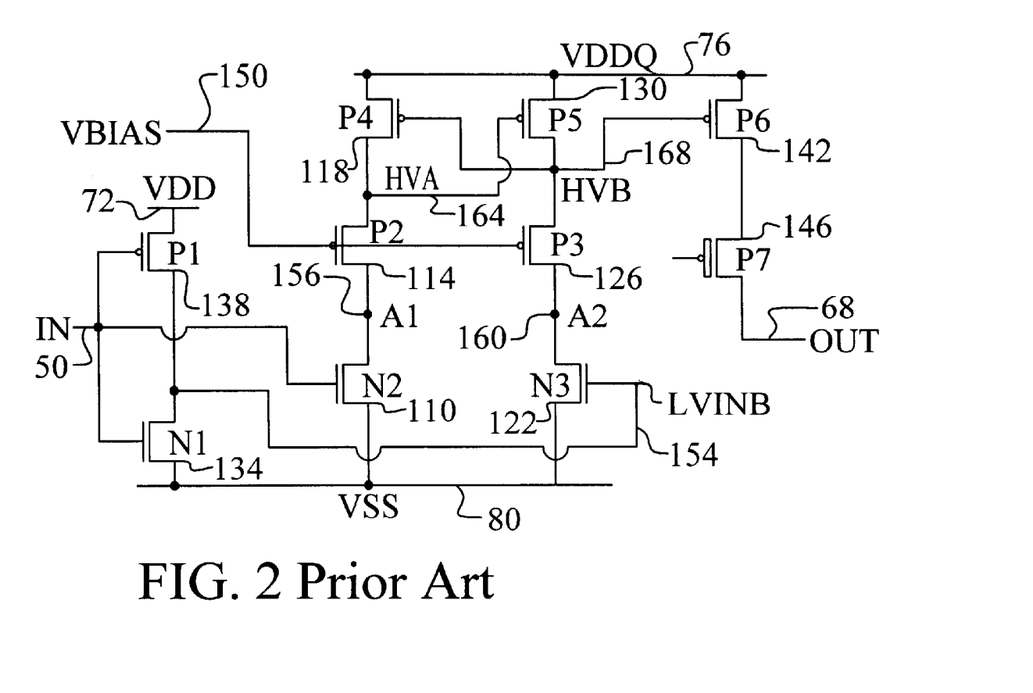
FIG. 2 illustrates a prior art level shifting circuit for a pull-up output.

Referring now to FIG. 2, a second prior art circuit is illustrated. This circuit attempts to overcome the disadvantageous of the first circuit by eliminating the high voltage transistors. In this case, 2-Volt transistors are used to drive a 3.3 Volt output level. Cascaded PMOS transistors P2 114 and P3 126 are used in the shifting circuit. By biasing the the gate voltages of P2 114 and P3 126 to VBIAS, HVB 168 is limited to between about 1.6 Volts and 3.3 Volts. This protects the output device P6 142 from overstress. While this approach avoids the scaling problem of FIG. 1 by using 2-Volt NMOS devices, that have lower thresholds than 3.3 Volt devices, the addition of the bias circuit to generate VBIAS 150 requires additional devices, consumes extra power, and requires even more circuits to shut down in sleep mode.

Figure 3:
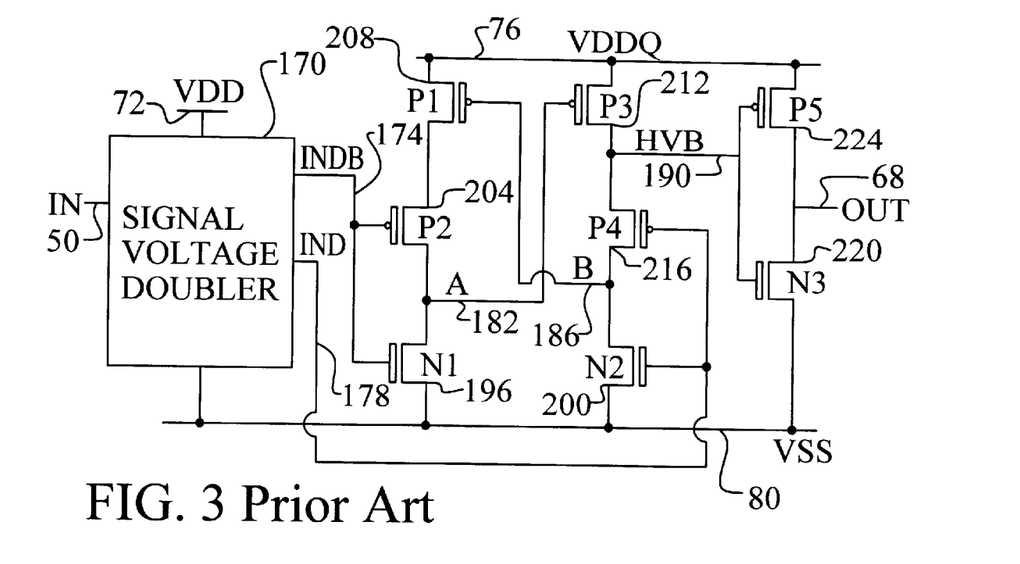
FIG. 3 illustrates a prior art level shifting circuit using pump-hopping.

Referring now to FIG. 3, another prior art level shifting circuit is shown. This circuit uses what is called a pump-hopping scheme. A signal voltage doubler 170 is used to pump up the differential signals IND 178 and INDB 174 to twice the VDD 72 level. A conventional level shifter using high voltage devices is then used to transform these pumped up differential signals to a single-ended output, OUT 68. This approach doubles the effective VDD and thus reduces the gap between VDD and the threshold voltage ($V_t$) of the 3.3 Volt NMOS devices. However, it takes about 5 nanoseconds in the worst PVT condition for the pumped differential to switch. This can be too slow for applications above several hundred MHz. In addition, if the input does not switch for some time, pumped charges will leak because of junction reversed-bias leakage. This will cause the doubled voltage to drop to VDD and makes the circuit susceptible to noise.

Several prior art inventions describe circuits for level shifting in low voltage CMOS applications. U.S. Pat. No. 5,539,334 to Clapp, III et al describes a voltage level shifting circuit where NMOS and PMOS transistors are stacked to sustain a higher voltage drop. The stacked devices are biased at a constant fraction of VCC. U.S. Pat. No. 5,821,800 to Le et al discloses a high voltage CMOS level shifter using NMOS/PMOS series intermediate pairs to divide the high voltage supply range into two or more sub-ranges. The pairs are biased to fractions of the high voltage. U.S. Pat. No. 5,963,061 to Briner teaches a level shifter circuit using stacked NMOS/PMOS devices biased to VCC to minimize transistor exposure to high voltage. U.S. Pat. No. 6,002,290 to Avery et al describes a criss-cross voltage level shifter using cascaded devices biased to VDD.

Finally, Co-pending U.S. patent application Ser. No. 09/784,823 (TSMC-00-067) to Wang et al filed on Feb. 20, 2001, teaches a level shifting circuit using zero threshold NMOS devices.

SUMMARY OF THE INVENTION

A principal object of the present invention is to provide a level shifting circuit, that is, a circuit that allows a digital signal to be level shifted from a low voltage supply to a high voltage supply.

A further object of the present invention is to provide a level shifting circuit to interface ultra-deep sub-micron CMOS circuits with I/O circuits.

Another further object of the present invention is to provide a level shifting circuit with high switching speed.

Another further object of the present invention is to provide a level shifting circuit with high reliability.

Another further object of the present invention is to provide a level shifting circuit with no static current draw.

Another further object of the present invention is to provide a level shifting circuit with no additional processing step costs compared to the standard CMOS process.

In accordance with the objects of this invention, a level-shifting circuit is achieved comprising, first, a first cascaded switch comprising a first NMOS transistor and a first zero threshold NMOS transistor. The gates of both of these NMOS transistors are coupled to a low voltage input signal. The drain of the first NMOS transistor is coupled to the source of the first zero threshold NMOS transistor. Second, a second cascaded switch is used. The second cascaded switch comprises a second NMOS transistor and a second zero threshold NMOS transistor. The gates of both of these second NMOS transistors are coupled to an inversion of the low voltage input signal. The drain of the second NMOS transistor is coupled to the source of the second zero threshold NMOS transistor. Finally, a cross-coupled pullup is used. The cross-coupled pull-up comprises a first PMOS transistor and a second PMOS transistor. The sources of both of these PMOS transistors are coupled to a high voltage supply. The gate of the second PMOS transistor and the drain of the first PMOS transistor are coupled to the drain of the first zero threshold NMOS transistor to form an inverted output. The gate of the first PMOS transistor and the drain of the second PMOS transistor are coupled to the drain of the second zero threshold NMOS transistor to form a non-inverted output.

Also in accordance with the objects of this invention, a level-shifting circuit is achieved comprising, first, a first cascaded switch comprising a first NMOS transistor, a first biased NMOS transistor, and a first zero threshold NMOS transistor. The gates of the first NMOS transistor and the first zero threshold NMOS transistor are coupled to a low voltage input signal. The first biased NMOS transistor is coupled between the drain of the first NMOS transistor and the source of the first zero threshold NMOS transistor. The gate of the first biased NMOS transistor is coupled to a constant voltage. Second, a second cascaded switch is used. The second cascaded switch comprises a second NMOS transistor, a second biased NMOS transistor, and a second zero threshold NMOS transistor. The gates of the second NMOS transistor and the second zero threshold NMOS transistor are coupled to an inversion of the low voltage input signal. The second biased NMOS transistor is coupled between the drain of the second NMOS transistor and the source of the second zero threshold NMOS transistor. The gate of the second biased NMOS transistor is coupled to the constant voltage. Finally, a cross-coupled pull-up is used. The cross-coupled pull-up comprises a first PMOS transistor and a second PMOS transistor. The sources of both of these PMOS transistors are coupled to a high voltage supply. The gate of the second PMOS transistor and the drain of the first PMOS transistor are coupled to the drain of the first zero threshold NMOS transistor to form an inverted output. The gate of the first PMOS transistor and the drain of the second PMOS transistor are coupled to the drain of the second zero threshold NMOS transistor to form a non-inverted output.

Also in accordance with the objects of this invention, a method to level-shift a signal is achieved. The method comprises generating an inversion of a low voltage input signal from a low voltage input signal. An inverted output and a non-inverted output are generated from the low voltage input signal and the inversion of said low voltage input signal using a circuit comprising, first, a first cascaded switch comprising a first NMOS transistor and a first zero threshold NMOS transistor. The gates of both NMOS transistors are coupled to the low voltage input signal. The drain of the first NMOS transistor is coupled to the source of the first zero threshold NMOS transistor. Second, a second cascaded switch is used comprising a second NMOS transistor and a second zero threshold NMOS transistor. The gates of both NMOS transistors are coupled to the inversion of the low voltage input signal. The drain of the second NMOS transistor is coupled to the source of the second zero threshold NMOS transistor. Finally, a cross-coupled pull-up is included comprising a first PMOS transistor and a second PMOS transistor. The sources of both PMOS transistors are coupled to a high voltage supply. The gate of the second PMOS transistor and the drain of the first PMOS transistor are coupled to the drain of the first zero threshold NMOS transistor to form an inverted output. The gate of the first PMOS transistor and the drain of the second PMOS transistor are coupled to the drain of the second zero threshold NMOS transistor to form a non-inverted output.

BRIEF DESCRIPTION OF THE DRAWINGS

In the accompanying drawings forming a material part of this description, there is shown.

DESCRIPTION OF THE PREFERRED EMBODIMENTS

The preferred embodiment discloses the application of the present invention to a level shifting circuit combining low voltage and high voltage devices. It should be clear to those experienced in the art that the present invention can be applied and extended without deviating from the scope of the present invention.

Figure 4:
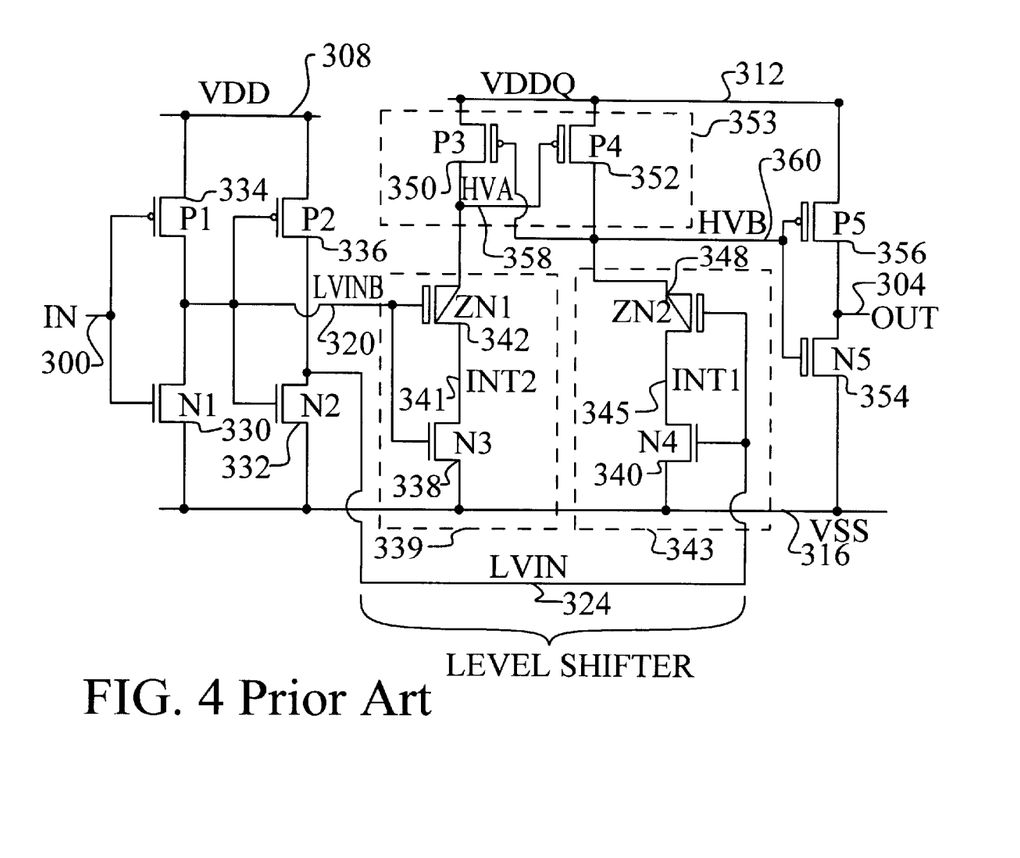
FIG. 4 illustrates the first preferred embodiment of the present invention.

Referring now particularly to FIG. 4, the first preferred embodiment of the present invention is shown. This schematic shows several important features of the present invention. The key blocks of the level shifter are outlined as the first cascaded switch 343, the second cascaded switch 339, and the cross-coupled pull-up 353.

More particularly, the level shifter comprises, first, a first cascaded switch 343 comprising a first NMOS transistor N4 340 and a first zero threshold NMOS transistor ZN2 348. The gates of both of these NMOS transistors N4 and ZN2 are coupled to a low voltage input signal, in this case LVIN 324. Note that the input IN 300 to the overall schematic is processed first through the inverter buffer created by N1 330 and P1 334 to generate LVINB 320. Next, LNINB 320 is processed through a second inverter buffer created by N2 332 and P2 336 to generate LVIN 324. The use of the buffers on the low voltage input signal are optional and not a necessary part of the invention. The invention does require a low voltage input signal (LVIN) and an inverted version of this low voltage signal (LVINB).

Returning to the description of the first cascaded switch 343 of the level shifter, the drain of the first NMOS transistor N4 340 is coupled to the source of the first zero threshold NMOS transistor ZN2 348. This is a critical feature of the present invention. The first zero threshold NMOS transistor ZN2 348 comprises an NMOS transistor with a zero threshold. Further, this first zero threshold NMOS transistor ZN2 348 preferably comprises a high voltage device constructed to withstand the high voltage supply level VDDQ 312 without breakdown. For example, the zero threshold NMOS transistor may have a substantially thicker oxide or deeper source and drain junctions than the low voltage devices of the process. Meanwhile, the first NMOS transistor N4 340 preferably comprises a low voltage transistor that is optimized for the lower supply voltage VDD and cannot withstand the high voltage supply VDDQ.

Similarly, a second cascaded switch 339 is used. This second cascaded switch 339 comprises a second NMOS transistor N3 338 and a second zero threshold NMOS transistor ZN1 342. Once again, the second zero threshold NMOS transistor ZN1 342 comprises a device with a zero threshold voltage. In addition, the second zero threshold NMOS transistor 342 preferably comprises a high voltage device while the second NMOS transistor N3 338 preferably comprises a low voltage device. As a key difference, the gates of both of these second NMOS transistors N3 and ZN1 are coupled to an inversion of the low voltage input signal, LVINB 320. The drain of the second NMOS transistor N3 is coupled to the source of the second zero threshold NMOS transistor ZN1.

Finally, a cross-coupled pull-up 353 is used. The cross-coupled pull-up 353 comprises a first PMOS transistor P4 352 and a second PMOS transistor P3 350. The sources of both of these PMOS transistors P3 and P4 are coupled to the high voltage supply VDDQ 312. The gate of the second PMOS transistor P3 350 and the drain of the first PMOS transistor P4 352 are coupled to the drain of the first zero threshold NMOS transistor ZN2 348 to form an inverted output HVB. The gate of the first PMOS transistor P4 352 and the drain of the second PMOS transistor P3 350 are coupled to the drain of the second zero threshold NMOS transistor ZN1 342 to form a non-inverted output HVA 358. Preferably, the PMOS transistors P3 and P4 comprise high voltage transistors capable of sustaining the high voltage VDDQ level without breakdown.

The novel circuit of the first preferred embodiment presents several advantages. First, the zero threshold NMOS devices ZN1 342 and ZN2 348 are constructed as high voltage devices. By cascaded these high voltage devices ZN1 and ZN2 with the low voltage NMOS devices N3 338 and N4 340, the low voltage NMOS transistors are protected from high voltage stress. Further, since ZN1 and ZN2 have zero thresholds, turning ON either cascaded switch 339 or 343 only requires a low voltage signal. Therefore, the circuit benefits from the excellent $I_{DSAT}$ of N3 and N4 and the fact that the thresholds of N3 and N4 will scale as the low voltage process is reduced in minimum feature size.

The unique coupling of the gates of the zero threshold device and the normal NMOS device to the low voltage input signal offers two additional advantages. First, the circuit operates with one cascaded switch ON while the other cascaded switch is OFF. For example, if the input signal IN 300 is high, the first cascaded switch 343, made up of N4 340 and ZN2 348, is also ON. Meanwhile, the second cascaded switch 339, made up of N3 338 and ZN1 342, is OFF. In this state, the second cascaded switch 339 has an internal voltage INT2 341 that is equal to $\Delta V$ where $\Delta V$ is the balanced voltage when the subthreshold leakage of ZN1 342 is equal to the combined junction reversed-bias leakages of ZN1 342 and N3 338. While the exact value of INT2 341 in this state is difficult to determine using a SPICE simulation due to inaccuracies in subthreshold leakage models in logic processes, the value will be less than the breakdown voltage of the low voltage NMOS device N3 338. Therefore, the novel circuit configuration serves to protect the low voltage NMOS devices of the cascaded switches.

Second, by turning OFF the zero threshold NMOS device, such as ZN1 342 in the example above, parasitic capacitance on the internal node INT2 341 can be isolated from the output node HVA 358 of this side of the level shifter. By isolating this parasitic capacitance, switching speed of the level shifter is increased.

The level shifter may be further enhanced by adding a CMOS inverter buffer as shown by N5 354 and P5 356. Constructed preferable of high voltage devices, this inverter buffer isolates the impedance at the output node OUT 304 from the internal nodes of the level shifter.

Figure 5:
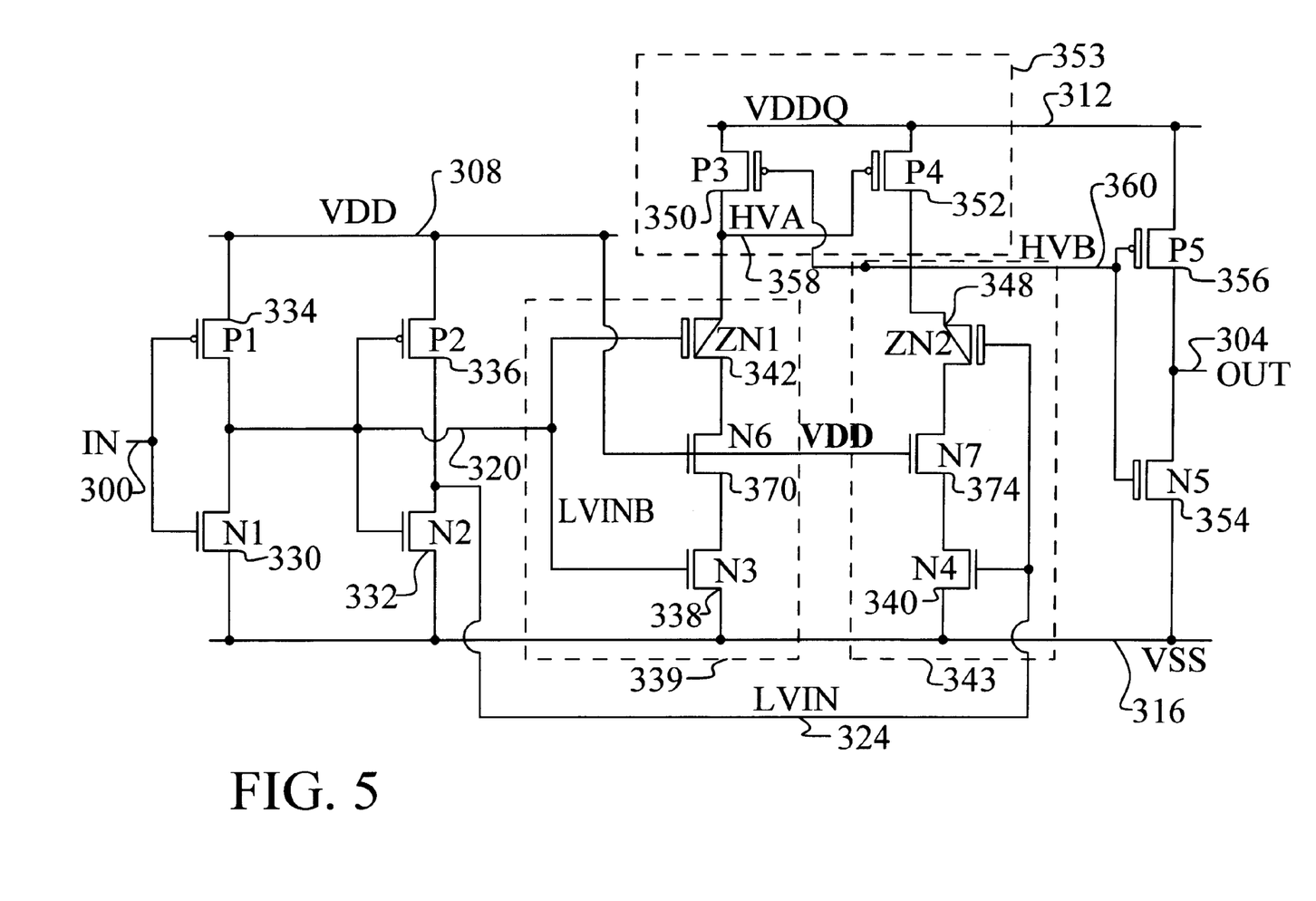
FIG. 5 illustrates the second preferred embodiment of the present invention.

Referring now to FIG. 5, a second preferred embodiment of the level shifter circuit is shown. In this embodiment, the high voltage performance of the device is further enhanced by adding additional NMOS devices N6 370 and N7 374 to the cascaded switches. In all other ways, the second preferred embodiment is like the first preferred embodiment. In particular, the second preferred embodiment comprises, first, a first cascaded switch 343 comprising a first NMOS transistor N4 340, a first biased NMOS transistor N7 374, and a first zero threshold NMOS transistor ZN2 348. The gates of the first NMOS transistor N4 and the first zero threshold NMOS transistor ZN2 are coupled to a low voltage input signal, in this case the buffered version of IN or LVIN 324. The first biased NMOS transistor N7 374 is coupled between the drain of the first NMOS transistor N4 and the source of the first zero threshold NMOS transistor ZN2. The gate of the first biased NMOS transistor N7 is coupled to a constant voltage. For example, the gate of N7 may be coupled to VDD 308 or to another constant voltage source.

Second, a second cascaded switch 339 is used. The second cascaded switch 339 comprises a second NMOS transistor N3 338, a second biased NMOS transistor N6 370, and a second zero threshold NMOS transistor ZN1 342. The gates of the second NMOS transistor N3 and the second zero threshold NMOS transistor ZN1 are coupled to an inversion of the low voltage input signal LVINB 320. The second biased NMOS transistor N6 370 is coupled between the drain of the second NMOS transistor N3 and the source of the second zero threshold NMOS transistor ZN1. The gate of the second biased NMOS transistor N6 is coupled to the constant voltage. For example, the gate of N6 may be coupled to VDD 308 or to another constant voltage source.

Finally, a cross-coupled pull-up is again used. The cross-coupled pull-up comprises a first PMOS transistor P3 350 and a second PMOS transistor P4 352. The sources of both of these PMOS transistors P3 and P4 are coupled to a high voltage supply VDDQ 312. The gate of the second PMOS transistor P3 and the drain of the first PMOS transistor P4 are coupled to the drain of the first zero threshold NMOS transistor ZN2 348 to form an inverted output HNB 360. The gate of the first PMOS transistor P4 and the drain of the second PMOS transistor P3 are coupled to the drain of the second zero threshold NMOS ZN1 342 transistor to form a non-inverted output HVA 358.

The presence of the biased NMOS transistors N6 370 and N7 374 in the cascaded switches 343 and 339 guarantees a lower voltage level on the drains of the N3 338 and N4 340. This improves the high voltage reliability of the circuit for larger VDDQ values.

Figure 6:
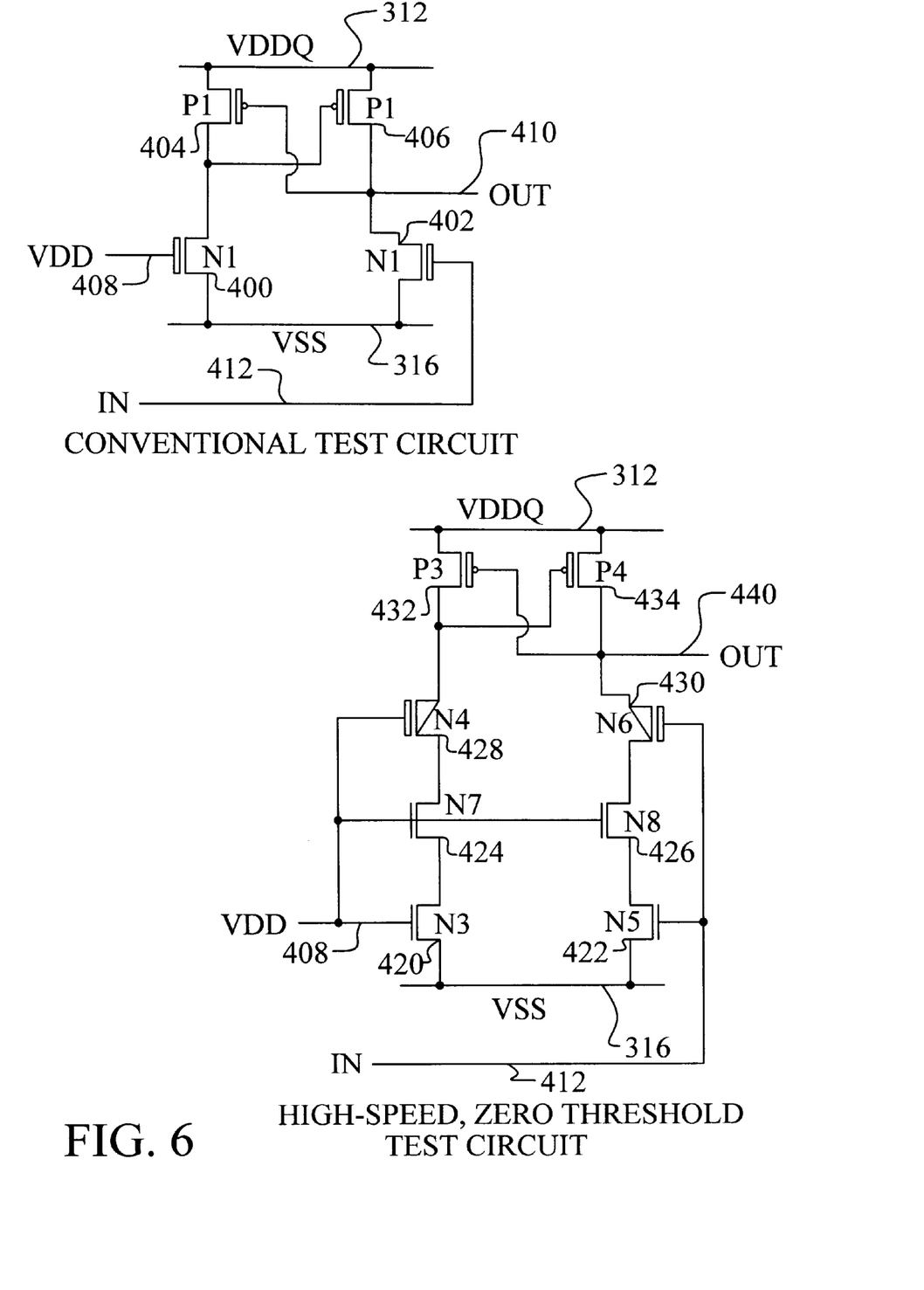
FIG. 6 illustrates the partial schematics used to simulate circuit performance of the present invention and of the prior art.
Figure 7:
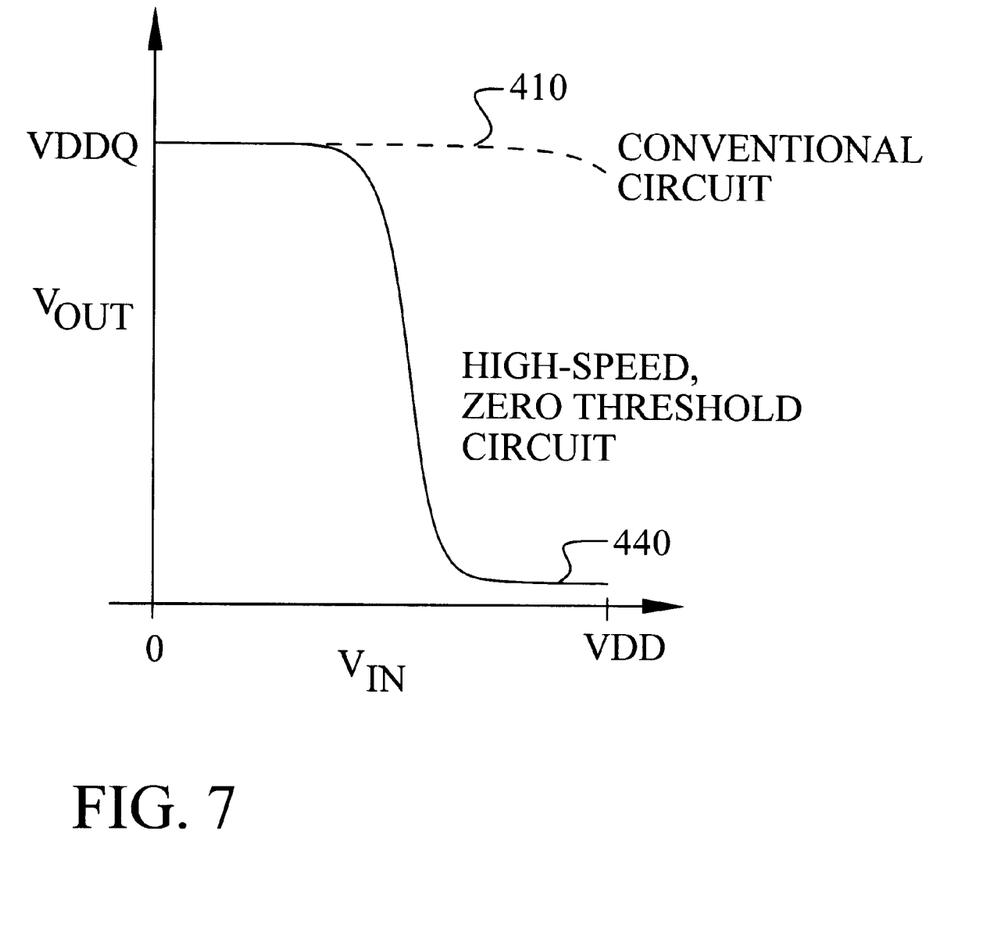
FIG. 7 graphically illustrates the transfer curve of the present invention and of the prior art.

Referring now to FIG. 6, the transfer characteristics of the prior art circuit and of the present invention may be simulated using the circuit schematics shown. One input to each level shifter is fixed to VDD 408. Meanwhile the input pin, IN 412 of each circuit is swept from 0 Volts to VDD. The output level is OUT 410 for the conventional circuit and OUT 440 for the new circuit. If the level shifter can toggle, the output voltage must reach a voltage drop of at least $V_t$ below the VDDQ voltage to turn on the PMOS device on the opposite of the cross-coupled pull-up (P1 404 in the conventional circuit and P3 432 in the new circuit). The most difficult part of the process and operational window is found at SF process, 0 degrees C., VDDQ=3.6 Volts, and VDD=0.9 Volts. At this process condition, even with pull down NMOS devices at a ratio as high as 60:1 to the PMOS pull up devices, the conventional level shifter cannot toggle as shown in FIG. 7. The output voltage of the conventional shifter, OUT 410 only drops to about VDDQ-0.4V at V(IN)= VDD. By comparison, the circuit of the present invention switches at near the mid-band of the input range. Finally, Simulation data for the circuit of the present invention shows a maximum propagation delay of only about 1 nanosecond even under worst case conditions.

As shown in the preferred embodiments, the present invention provides an effective level shifting circuit. The level shifting circuit is useful for the interface of ultra-deep sub-micron CMOS circuits with I/O circuits. The circuit demonstrates high switching speed and high reliability. The level shifting circuit has no static current draw and adds no additional processing step costs compared to the standard CMOS process.

While the invention has been particularly shown and described with reference to the preferred embodiments thereof, it will be understood by those skilled in the art that various changes in form and details may be made without departing from the spirit and scope of the invention.

What is claimed is:

1. A level-shifting circuit comprising:
   a first cascaded switch comprising a first NMOS transistor and a first zero threshold NMOS transistor wherein the gates of both said NMOS transistors are coupled to a low voltage input signal, and wherein the drain of said first NMOS transistor is coupled to the source of said first zero threshold NMOS transistor;
   a second cascaded switch comprising a second NMOS transistor and a second zero threshold NMOS transistor wherein the gates of both said NMOS transistors are coupled to an inversion of said low voltage input signal, and wherein the drain of said second NMOS transistor is coupled to the source of said second zero threshold NMOS transistor; and
   a cross-coupled pull-up comprising a first PMOS transistor and a second PMOS transistor wherein the sources of both said PMOS transistors are coupled to a high voltage supply, wherein the gate of said second PMOS transistor and the drain of said first PMOS transistor are coupled to the drain of said first zero threshold NMOS transistor to form an inverted output, and wherein the gate of said first PMOS transistor and the drain of said second PMOS transistor are coupled to the drain of said second zero threshold NMOS transistor to form a non-inverted output.

2. The circuit according to claim 1 wherein said PMOS transistors comprise high voltage devices.

3. The circuit according to claim 1 wherein said zero threshold NMOS transistors comprise high voltage devices.

4. The circuit according to claim 1 further comprising a CMOS inverter wherein the input to said CMOS inverter is coupled to said inverted output.

5. The circuit according to claim 4 wherein said CMOS inverter comprises high voltage transistors.

6. The circuit according to claim 1 wherein said first cascade switch further comprises an additional NMOS transistor coupled between said first NMOS transistor drain and said first zero threshold NMOS transistor source wherein the gate of said additional NMOS transistor is coupled to a constant voltage.

7. The circuit according to claim 1 wherein said second cascade switch further comprises an additional NMOS transistor coupled between said second NMOS transistor drain and said second zero threshold NMOS transistor source wherein the gate of said additional NMOS transistor is coupled to a constant voltage.

8. The circuit according to claim 7 wherein said additional NMOS transistor comprises a low voltage device.

9. A level-shifting circuit comprising:
   a first cascaded switch comprising a first NMOS transistor and a first zero threshold NMOS transistor wherein the gates of both said first NMOS transistors are coupled to a low voltage input signal, and wherein the drain of said first NMOS transistor is coupled to the source of said first zero threshold NMOS transistor;
   a second cascaded switch comprising a second NMOS transistor and a second zero threshold NMOS transistor wherein the gates of both said second NMOS transistors are coupled to an inversion of said low voltage input signal, and wherein the drain of said second NMOS transistor is coupled to the source of said second zero threshold NMOS transistor;
   a cross-coupled pull-up comprising a first PMOS transistor and a second PMOS transistor wherein the sources of both said PMOS transistors are coupled to a high voltage supply, wherein the gate of said second PMOS transistor and the drain of said first PMOS transistor are coupled to the drain of said first zero threshold NMOS transistor to form an inverted output, and wherein the gate of said first PMOS transistor and the drain of said second PMOS transistor are coupled to the drain of said second zero threshold NMOS transistor to form a non-inverted output; and
   a CMOS inverter wherein the input to said CMOS inverter is coupled to said inverted output.

10. The circuit according to claim 9 wherein said PMOS transistors comprise high voltage devices.

11. The circuit according to claim 9 wherein said zero threshold NMOS transistors comprise high voltage devices.

12. The circuit according to claim 9 wherein said CMOS inverter comprises high voltage transistors.

13. The circuit according to claim 9 wherein said first cascade switch further comprises an additional NMOS transistor coupled between said first NMOS transistor drain and said first zero threshold NMOS transistor source wherein the gate of said additional NMOS transistor is coupled to a constant voltage.

14. The circuit according to claim 9 wherein said second cascade switch further comprises an additional NMOS transistor coupled between said second NMOS transistor drain and said second zero threshold NMOS transistor source wherein the gate of said additional NMOS transistor is coupled to a constant voltage.

15. A level-shifting circuit comprising:
a first cascaded switch comprising a first NMOS transistor, a first biased NMOS transistor, and a first zero threshold NMOS transistor wherein the gates of said first NMOS transistor and said first zero threshold NMOS transistor are coupled to a low voltage input signal, wherein said first biased NMOS transistor is coupled between the drain of said first NMOS transistor and the source of said first zero threshold NMOS transistor, and wherein the gate of said first biased NMOS transistor is coupled to a constant voltage;
a second cascaded switch comprising a second NMOS transistor, a second biased NMOS transistor, and a second zero threshold NMOS transistor wherein the gates of said second NMOS transistor and said second zero threshold NMOS transistor are coupled to an inversion of said low voltage input signal, wherein said second biased NMOS transistor is coupled between the drain of said second NMOS transistor and the source of said second zero threshold NMOS transistor, and wherein the gate of said second biased NMOS transistor is coupled to said constant voltage; and
a cross-coupled pull-up comprising a first PMOS transistor and a second PMOS transistor wherein the sources of both said PMOS transistors are coupled to a high voltage supply, wherein the gate of said second PMOS transistor and the drain of said first PMOS transistor are coupled to the drain of said first zero threshold NMOS transistor to form an inverted output, and wherein the gate of said first PMOS transistor and the drain of said second PMOS transistor are coupled to the drain of said second zero threshold NMOS transistor to form a non-inverted output.

16. The circuit according to claim 15 wherein said PMOS transistors comprise high voltage devices.

17. The circuit according to claim 15 wherein zero threshold NMOS transistors comprise high voltage devices.

18. The circuit according to claim 15 wherein said biased NMOS transistors comprise low voltage devices.

19. The circuit according to claim 15 further comprising a CMOS inverter wherein the input to said CMOS inverter is coupled to said inverted output.

20. The circuit according to claim 19 wherein said CMOS inverter comprises high voltage transistors.

21. A method to level-shift a signal comprising:
generating an inversion of a low voltage input signal from said low voltage input signal; and
generating an inverted output and a non-inverted output from said low voltage input signal and said inversion of said low voltage input signal using a circuit comprising:
a first cascaded switch comprising a first NMOS transistor and a first zero threshold NMOS transistor wherein the gates of both said NMOS transistors are coupled to said low voltage input signal and wherein the drain of said first NMOS transistor is coupled to the source of said first zero threshold NMOS transistor;
a second cascaded switch comprising a second NMOS transistor and a second zero threshold NMOS transistor wherein the gates of both said NMOS transistors are coupled to said inversion of said low voltage input signal and wherein the drain of said second NMOS transistor is coupled to the source of said second zero threshold NMOS transistor; and
a cross-coupled pull-up comprising a first PMOS transistor and a second PMOS transistor wherein the sources of both said PMOS transistors are coupled to a high voltage supply, wherein the gate of said second PMOS transistor and the drain of said first PMOS transistor are coupled to the drain of said first zero threshold NMOS transistor to form an inverted output, and wherein the gate of said first PMOS transistor and the drain of said second PMOS transistor are coupled to the drain of said second zero threshold NMOS transistor to form a non-inverted output.

22. The method according to claim 21 wherein said PMOS transistors comprise high voltage devices.

23. The method according to claim 21 wherein said zero threshold NMOS transistors comprise high voltage devices.

24. The method according to claim 21 wherein said first cascade switch further comprises an additional NMOS transistor coupled between said first NMOS transistor drain and said first zero threshold NMOS transistor source wherein the gate of said additional NMOS transistor is coupled to a constant voltage.

25. The method according to claim 21 wherein said second cascade switch further comprises an additional NMOS transistor coupled between said second NMOS transistor drain and said second zero threshold NMOS transistor source wherein the gate of said additional NMOS transistor is coupled to a constant voltage.

* * * * *